United States Patent
Lee et al.

(10) Patent No.: US 10,672,858 B2
(45) Date of Patent: Jun. 2, 2020

(54) DISPLAY APPARATUS AND MULTI-SCREEN DISPLAY APPARATUS INCLUDING THE SAME

(71) Applicant: LG DISPLAY CO., LTD., Seoul (KR)

(72) Inventors: Moonsun Lee, Osan-si (KR); Seongwoo Park, Paju-si (KR); HaeYoon Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/119,859

(22) Filed: Aug. 31, 2018

(65) Prior Publication Data

US 2019/0067411 A1 Feb. 28, 2019

(30) Foreign Application Priority Data

Aug. 31, 2017 (KR) .......................... 10-2017-0111085

(51) Int. Cl.
| | | |
|---|---|---|
| *G02F 1/1333* | (2006.01) | |
| *H01L 51/50* | (2006.01) | |
| *H01L 27/32* | (2006.01) | |
| *H01L 51/00* | (2006.01) | |
| *H01L 51/52* | (2006.01) | |

(52) U.S. Cl.
CPC .... *H01L 27/3293* (2013.01); *G02F 1/133305* (2013.01); *H01L 27/3276* (2013.01); *H01L 51/0097* (2013.01); *H01L 51/5246* (2013.01); *H01L 51/5253* (2013.01); *G02F 1/13336* (2013.01); *G02F 1/133308* (2013.01); *H01L 2251/5338* (2013.01)

(58) Field of Classification Search
CPC .......... G06F 1/1641; H01L 2251/5338; H01L 51/0097; H01L 27/3276; H01L 27/3293; H01L 51/5246; H01L 51/5253; G02F 1/133305; G02F 1/133308; G02F 1/13336
See application file for complete search history.

(56) References Cited

U.S. PATENT DOCUMENTS

| | | | |
|---|---|---|---|
| 2006/0001796 | A1 | 1/2006 | Chang et al. |
| 2009/0015777 | A1 | 1/2009 | Nakanishi |
| 2010/0065832 | A1* | 3/2010 | Sugimoto ........... H01L 27/3293 257/40 |
| 2013/0002133 | A1 | 1/2013 | Jin et al. |

(Continued)

FOREIGN PATENT DOCUMENTS

| | | |
|---|---|---|
| EP | 1 337 892 A1 | 8/2003 |
| EP | 2 306 437 A1 | 4/2011 |

(Continued)

*Primary Examiner* — Eric A. Ward
(74) *Attorney, Agent, or Firm* — Birch, Stewart, Kolasch & Birch, LLP

(57) ABSTRACT

A display apparatus can includes a first substrate including an active area, a non-active area surrounding the active area, and a bending part bent in a curve shape; a pixel array layer disposed in the active area of the first substrate; a second substrate disposed on the pixel array layer in which the pixel array layer is between the first substrate and the second substrate; and a cover layer disposed in the non-active area of the first substrate, the cover layer covering a side surface of the second substrate, in which the cover layer is disposed in a remaining portion of the non-active area except for an area of the non-active area that overlaps with the bending part.

16 Claims, 4 Drawing Sheets

(56) References Cited

U.S. PATENT DOCUMENTS

| | | |
|---|---|---|
| 2013/0002583 A1 | 1/2013 | Jin et al. |
| 2013/0194761 A1 | 8/2013 | Kim |
| 2014/0065430 A1 | 3/2014 | Yamazaki et al. |
| 2014/0098471 A1* | 4/2014 | Nam .................. H05K 7/00 361/679.01 |
| 2015/0036300 A1 | 2/2015 | Park et al. |
| 2015/0162392 A1* | 6/2015 | Lim .................. H01L 27/3244 257/72 |
| 2016/0099435 A1* | 4/2016 | Yang .................. H01L 51/5253 257/88 |
| 2016/0299527 A1* | 10/2016 | Kwak .................. G06F 1/1626 |
| 2016/0307973 A1 | 10/2016 | Yang et al. |
| 2017/0018731 A1* | 1/2017 | Cao .................. H01L 51/524 |
| 2018/0011576 A1* | 1/2018 | Ryu .................. G06F 1/1652 |
| 2018/0033997 A1* | 2/2018 | Tang .................. H01L 51/0097 |
| 2018/0259805 A1* | 9/2018 | Takehara .......... G02F 1/133305 |
| 2019/0033652 A1* | 1/2019 | Sano ................ G02F 1/133305 |

FOREIGN PATENT DOCUMENTS

| | | |
|---|---|---|
| EP | 2 717 244 A1 | 4/2014 |
| JP | 2003-330005 A | 11/2003 |
| JP | WO2008/123416 A1 | 10/2008 |
| JP | 2009-20207 A | 1/2009 |
| JP | 2013-15835 A | 1/2013 |
| JP | 2013-15836 A | 1/2013 |
| JP | 2017-126081 A | 7/2017 |
| KR | 10-2013-008903 A | 8/2013 |
| WO | WO 02/42838 A1 | 5/2002 |
| WO | WO 2010/070871 A1 | 6/2010 |

\* cited by examiner

DISPLAY APPARATUS AND MULTI-SCREEN DISPLAY APPARATUS INCLUDING THE SAME

CROSS-REFERENCE TO RELATED APPLICATIONS

This application claims the priority benefit of the Korean Patent Application No. 10-2017-0111085 filed in the Republic of Korea on Aug. 31, 2017, the entirety of which is hereby incorporated by reference as if fully set forth herein.

BACKGROUND

Field of the Invention

The present disclosure relates to a display apparatus and a multi-screen display apparatus including the same.

Discussion of the Related Art

With the advancement of an information-oriented society, various requirements for display apparatuses for displaying an image are increasing. Recently, display apparatuses which are even slimmer are being released. Flexible display apparatuses are easy to carry and may be applied to various image display apparatuses.

Flexible display apparatuses include a bending part which enables a substrate to be folded. Since the substrate is folded by using the bending part, a bezel size is reduced, and thus, display apparatuses having a narrow bezel may be implemented.

However, as a degree of bending increases for realizing a narrower bezel, an outermost strain increases, and an internal strain of a panel is also increased. For this reason, a light emitting device layer gets peeled off, and a thin film transistor is short-circuited.

Moreover, multi-screen display apparatuses each include a large display screen where a plurality of screen devices including a related art display apparatus are arranged in a lattice type, and are being commercialized.

However, in a related art multi-screen display apparatus, a boundary portion between display apparatuses that are connected to each other exists due to bezel areas of the display apparatuses. When displaying one image on a whole screen, the boundary portion causes a sense of discontinuity of the whole screen, and due to this, immersion in an image is reduced.

SUMMARY

Accordingly, the present disclosure is directed to a display apparatus and a multi-screen display apparatus including the same that substantially obviate one or more problems due to limitations and disadvantages of the related art.

An aspect of the present disclosure is directed to a display apparatus in which bending is easily performed, thereby realizing a zero bezel.

Another aspect of the present disclosure is directed to a multi-screen display apparatus in which a boundary portion between display apparatuses is removed or minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a first substrate including an active area, a non-active area surrounding the active area, and a bending part bent in a curve shape, a pixel array layer provided in the active area of the first substrate, a second substrate provided on the pixel array layer, and a cover layer provided in the non-active area of the first substrate to cover a side surface of the second substrate, in which the cover layer is provided in a remaining non-active area except an area overlapping the bending part.

In another aspect of the present disclosure, there is provided a multi-screen display apparatus including a plurality of screen modules including a plurality of side surfaces, side surfaces parallel to each other among the plurality of side surfaces being closely adhered to each other, in which each of the plurality of screen modules includes the display apparatus comprising a first substrate including an active area, a non-active area surrounding the active area, and a bending part bent in a curve shape, a pixel array layer provided in the active area of the first substrate, a second substrate provided on the pixel array layer, and a cover layer provided in the non-active area of the first substrate to cover a side surface of the second substrate, in which the cover layer is provided in a remaining non-active area except for an area overlapping the bending part, and bending parts of adjacent display apparatuses contact each other.

Both the foregoing general description and the following detailed description of the present disclosure are explanatory and are intended to provide examples and further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
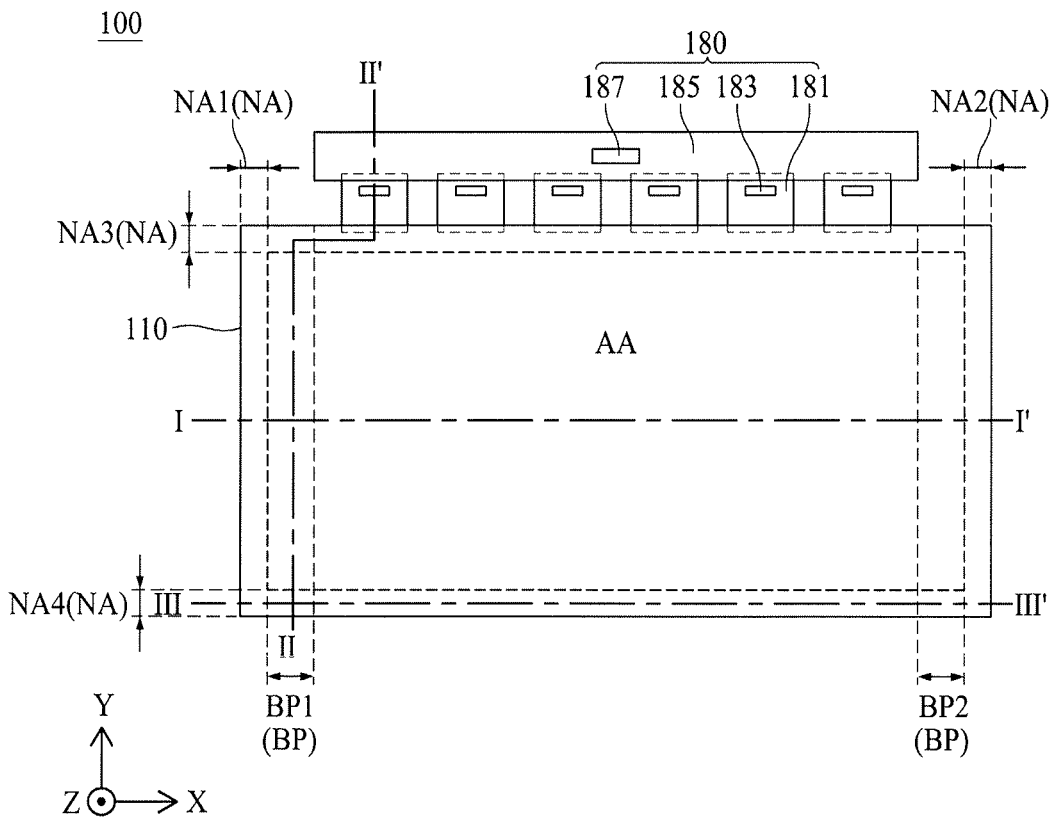
FIG. 1 is a plan view illustrating an unbent state of a display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by the scopes of the claims.

A shape, a size, a ratio, an angle, and a number disclosed in the drawings illustrating embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure points of the present disclosure, the detailed description will be omitted.

When "comprise", "have", and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~", "over~", "under~", and "next~", one or more other parts may be disposed between the two parts unless "just" or "direct" is used.

In describing a time relationship, for example, when the temporal order is described as "after~", "subsequent~", "next~", and "before~", a situation which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The phrase "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be performed independently from each other, or can be performed together in co-dependent relationship.

Hereinafter, example embodiments of a display apparatus and a multi-screen display apparatus including the same according to embodiments of the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
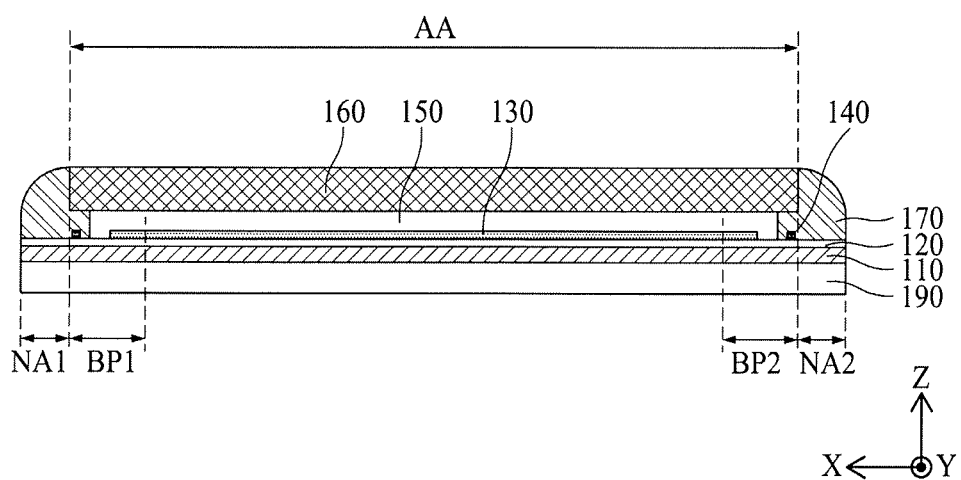
FIG. 2 is a cross-sectional view taken along line I-I' illustrated in FIG. 1 according to an embodiment of the present disclosure.

FIG. 1 is a plan view illustrating an unbent state of a display apparatus 100 according to an embodiment of the present disclosure, and FIG. 2 is a cross-sectional view taken along line I-I' illustrated in FIG. 1.

Referring to FIGS. 1 and 2, the display apparatus 100 according to an embodiment of the present disclosure can include a first substrate 110, a pixel array layer 130, a second substrate 160, and a cover layer 170.

The first substrate 110, e.g., a base substrate, can be a flexible substrate. For example, the first substrate 110 can include a transparent polyimide material. The first substrate 110 including the transparent polyimide material can be formed by curing a polyimide resin which is coated to have a certain thickness on a front surface of a release layer provided on a carrier glass substrate. In this instance, the carrier glass substrate can be separated from the first substrate 110 by releasing the release layer through a laser release process.

The first substrate 110 can include an active area AA, a non-active area NA, and a bending part BP.

The active area AA can be a display area which displays an image, and can be defined in a center portion of the first substrate 110. The active area AA can be defined as an area where the pixel array layer 130 for displaying an image is disposed.

The non-active area NA can be a non-display area which does not display an image, and can be defined in an edge of the first substrate 110 to surround the active area AA. The non-active area NA can include first to fourth non-active areas NA1 to NA4. For example, with respect to a plane, the first non-active area NA1 can be a left non-active area of the first substrate 110, the second non-active area NA2 can be a right non-active area of the first substrate 110, the third non-active area NA3 can be an upper non-active area of the first substrate 110, and the fourth non-active area NA4 can be a lower non-active area of the first substrate 110.

The bending part BP can be defined as a part which is bent in a curve shape. This is in contrast to the other parts which are substantially flat.

The bending part BP according to an embodiment can include a first bending part BP1, which is disposed on the right of the first non-active area NA1, and a second bending part BP2, which is disposed on the left of the second non-active area NA2 in parallel with the first bending part BP1.

The first bending part BP1 and the second bending part BP2 can each be defined as an edge display area which displays an image on a side surface of the display apparatus 100. Also, an active area AA other than the first and second bending parts BP1 and BP2 can be defined as a front display area.

A buffer layer 120 can be provided on the first substrate 110. The buffer layer 120 can be provided on a whole top of the first substrate 110, for preventing water from penetrating into the active area AA via the first substrate 110. The buffer layer 120 according to an embodiment can be formed of a plurality of inorganic layers which are alternately stacked. For example, the buffer layer 120 can be formed of a multilayer where one or more inorganic layers of silicon oxide (SiOx), silicon nitride (SiNx), and silicon oxynitride (SiON) are alternately stacked.

The pixel array layer 130 can be disposed in the active area AA of the first substrate 110. That is, the pixel array layer 130 can be provided on the buffer layer 120 overlapping the active area AA defined on the first substrate 110.

The pixel array layer 130 can include a plurality of scan lines, a plurality of data lines, a plurality of driving power lines, a pixel driving circuit, and a light emitting device layer.

The scan lines can be arranged in parallel with a first lengthwise direction X of the first substrate 110 and can spaced apart from one another along a second lengthwise direction Y of the first substrate 110.

The data lines can be arranged in parallel with the second lengthwise direction Y of the first substrate 110 and can spaced apart from one another along the first lengthwise direction X of the first substrate 110.

The driving power lines can be arranged in parallel with the data lines.

The pixel driving circuit can be provided in each of a plurality of pixel areas defined by intersections of the scan lines and the data lines and can include at least two thin film transistors (TFTs) and at least one capacitor. The pixel driving circuit can allow the light emitting device layer to emit light according to a scan signal supplied through an adjacent scan line, a driving power supplied through an adjacent driving power line, and a data signal supplied through an adjacent data line.

The light emitting device layer can emit light, based on a data signal supplied from the pixel driving circuit of a corresponding pixel. The light emitted from the light emitting device layer can pass through the first substrate 110 and can be extracted to the outside. The light emitting device layer can include a first electrode connected to the pixel driving circuit of a corresponding pixel, a light emitting layer provided on the first electrode, and a second electrode provided on the light emitting layer.

The first electrode can be an anode electrode which is individually patterned in each of a plurality of pixels. The first electrode can be formed of a transparent metal material such as indium tin oxide (ITO) or indium zinc oxide (IZO) capable of transmitting light.

The light emitting layer according to an embodiment can include a red light emitting layer, a green light emitting layer, and a blue light emitting layer, which each emit light corresponding to a color set in a corresponding pixel.

According to another embodiment, the light emitting layer can be a common layer which is provided in common in the plurality of pixels P, and in this instance, a manufacturing process is simplified. The light emitting layer can include one of an organic light emitting layer, an inorganic light emitting layer, and a quantum dot light emitting layer, or can include a stacked or mixed structure of an organic light emitting layer or an inorganic light emitting layer and a quantum dot light emitting layer. The light emitting layer can include two or more light emitting parts for emitting white light. For example, the light emitting layer can include a first light emitting part and a second light emitting part for emitting the white light based on a combination of first light and second light. Here, the first light emitting part can emit the first light and can include one of a blue light emitting part, a green light emitting part, a red light emitting part, a yellow light emitting part, and a yellow-green light emitting part. The second light emitting part can include a light emitting part emitting light having a complementary color relationship of the first light among a blue light emitting part, a green light emitting part, a red light emitting part, a yellow light emitting part, and a yellow-green emitting part.

The second electrode, e.g., a cathode electrode, can be a common layer which is provided in common in the plurality of pixels. The second electrode can include a metal material, which is high in reflectivity. For example, the second electrode can be formed in a multilayer structure such as a stacked structure (Ti/Al/Ti) of Al and Ti, a stacked structure (ITO/Al/ITO) of Al and ITO, an APC (Ag/Pd/Cu) alloy, or a stacked structure (ITO/APC/ITO) of an APC alloy and ITO, or can include a single-layer structure including one material or two or more alloy materials selected from among Ag, Al, Mo, Au, Mg, calcium (Ca), and barium (Ba).

The second substrate 160 can be disposed on the pixel array layer 130 and can include a first surface adjacent to the pixel array layer 130 and a second surface opposite to the first surface. The first surface of the second substrate 160 can be attached on the pixel array layer 130. The second substrate 160 can primarily prevent oxygen or water from penetrating into the light emitting device layer.

The second substrate 160 according to an embodiment can be a metal foil, a metal sheet, or a metal plate, which is formed of an opaque metal material. For example, the second substrate 160 can be formed of an alloy of iron (Fe) and nickel (Ni) having a low thermal expansion coefficient, but is not limited thereto.

The first surface of the second substrate 160 can be attached on the pixel array layer 130 by an adhesive layer 150. The adhesive layer 150 can be a thermocurable adhesive, a naturally curable adhesive, or the like. For example, the adhesive layer 150 can be formed of a pressure sensitive adhesive material or a barrier pressure sensitive adhesive material having an absorption function.

The cover layer 170 can be provided in the non-active area NA of the first substrate 110 to cover a side surface of the second substrate 160. The cover layer 170 can include a polymer material, and for example, can be formed of urethane, acryl, or/and the like. The cover layer 170 according to an embodiment can be provided higher in height than the adhesive layer 150 in the non-active area NA contacting the active area AA of the first substrate 110 and the cover layer 170 can prevent penetration of water passing through the adhesive layer 150.

The cover layer 170 can be provided to contact the second substrate 160 at an outer portion of the active area AA, in order for a side surface of the light emitting device layer not to be exposed through the adhesive layer 150.

The cover layer 170 according to an embodiment can be provided for preventing the first substrate 110 from being rolled while the carrier glass substrate is separated from the first substrate 110 by releasing the release layer through the laser release process. In more detail, the second substrate 160 can not be provided in the non-active area NA of the first substrate 110, and for this reason, the first substrate 110 which is flexible and has a thin thickness is rolled. The cover layer 170 can be provided in the non-active area NA of the first substrate 110 to prevent the first substrate 110 from being rolled, and a lamination process of forming a light-transmitting film 190 for supporting the first substrate 110 can be easily performed.

Additionally, the display apparatus according to embodiments of the present disclosure can further include a scan driving circuit 140 and a display driving circuit unit 180.

The scan driving circuit 140 can be provided in each of a left end and a right end of the active area AA of the first substrate 110. The scan driving circuit 140 can generate a scan signal according to a scan control signal supplied from the display driving circuit unit 180 and can supply the scan signal to the scan lines in a predetermined order. The scan driving circuit 140 according to an embodiment can be formed in the active area AA of the first substrate 110 along with TFTs. For example, the scan driving circuit 140 can be disposed in one of the left end and the right end of the active area AA contacting the first non-active area NA1 and the second non-active area NA2 of the first substrate 110.

The display driving circuit unit 180 can be connected to a pad part provided in the third non-active area NA3 of the first substrate 110 and can display an image corresponding to video data supplied from a display driving system. The display driving circuit unit 180 according to an embodiment can include a plurality of flexible circuit films 181, a plurality of data driving integrated circuits (ICs) 183, a printed circuit board (PCB) 185, and a timing controller 187.

Input terminals provided on one side of each of the plurality of flexible circuit films 181 can be attached on the PCB 185 through a film attachment process, and output terminals provided on the other side of each of the plurality of flexible circuit films 181 can be attached on the pad part provided in the first substrate 110 through the film attachment process.

Each of the plurality of data driving ICs 183 can be individually mounted on a corresponding flexible circuit film of the plurality of flexible circuit films 181. Each of the plurality of data driving ICs 183 can receive pixel data and a data control signal supplied from the timing controller 187 and can convert the pixel data into a pixel-based analog data signal according to the data control signal to supply the analog data signal to a corresponding data line.

The PCB 185 can support the timing controller 187 and can transfer signals and power between the elements of the display driving circuit unit 180.

The timing controller 187 can be mounted on the PCB 185 and can receive the image data and a timing synchronization signal supplied from the display driving system through a user connector provided on the PCB 185. The timing controller 187 can align the video data based on the timing synchronization signal to generate pixel data suitable for a pixel arrangement structure of the pixel array layer 130 and can supply the generated pixel data to a corresponding data driving IC 183. Also, the timing controller 187 can generate the data control signal and the scan control signal according to the timing synchronization signal, control a driving timing of each of the plurality of data driving ICs 183 by using the data control signal, and control a driving timing of the scan driving circuit 140 by using the scan control signal. Here, the scan control signal can be supplied to a first or last flexible circuit film of the plurality of flexible circuit films 181 and can be supplied to the scan driving circuit 140 through the non-active area NA of the first substrate 110.

Additionally, the display apparatus according to embodiments of the present disclosure can further include the light-transmitting film 190 which is attached on the first substrate 110 to overlap the first substrate 110.

The light-transmitting film 190 can be attached on the second surface opposite to the first surface on which the buffer layer 120 is provided on the first substrate 110, by using a transparent adhesive layer, and thus, bending is easily performed without damaging the bending part BP, and an area other than the bending part BP is maintained in a planar state. The light-transmitting film 190 according to an embodiment can be formed of a flexible film, and for example, can be one of a polyethylene terephthalate film, an anti-reflective film, a polarizing film, and transmittance controllable film. The light-transmitting film 190 can be attached on the second surface, separated from the carrier glass substrate, of the first substrate 110. The transparent adhesive layer can be an optically clear resin (OCR), an optically clear adhesive (OCA), or the like.

Figure 3:
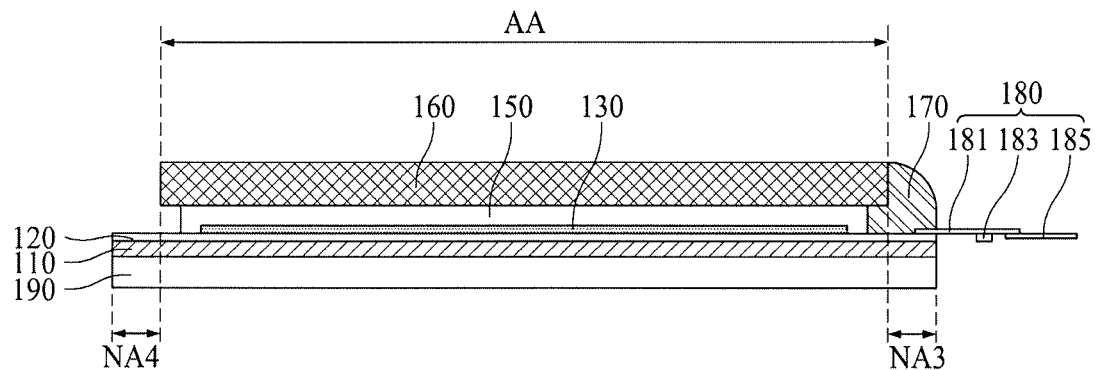
FIG. 3 is a cross-sectional view taken along line II-II' illustrated in FIG. 1 according to an embodiment of the present disclosure.
Figure 4:
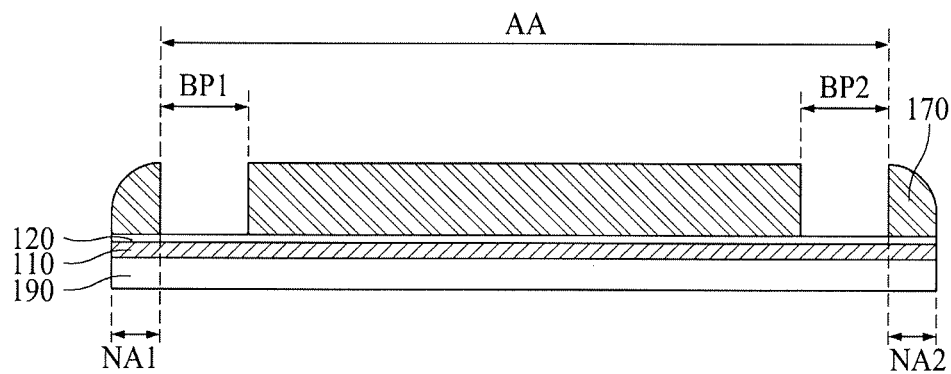
FIG. 4 is a cross-sectional view taken along line illustrated in FIG. 1 according to an embodiment of the present disclosure.

FIG. 3 is a cross-sectional view taken along line II-II' illustrated in FIG. 1, and FIG. 4 is a cross-sectional view taken along line illustrated in FIG. 1.

Referring to FIGS. 3 and 4, the display apparatus 100 according to embodiments of the present disclosure can include the first substrate 110, the pixel array layer 130, the second substrate 160, and the cover layer 170. Hereinafter, only an additional feature of the cover layer 170 will be described, like reference numerals refer to like elements, and overlapping descriptions of the other elements are omitted.

The cover layer 170 can be provided in the non-active area NA except an area overlapping the bending part BP, e.g., the cover layer 170 is not present in at least some of or all of an area overlapping with the bending part BP. In more detail, the cover layer 170 may not be provided in a portion of each of the third and fourth non-active areas NA3 and NA4, where bending is not performed. The cover layer 170 according to an embodiment is vulnerable to a strain, and for this reason, when an outermost strain increases due to the cover layer 170 when bending is performed, an internal strain of a panel is increased. For this reason, the light emitting device layer gets peeled off, the TFT is short-circuited, or an inorganic layer is damaged. Further, in the display apparatus 100 according to embodiments of the present disclosure, the cover layer 170 may not be disposed in an area overlapping the bending part BP, thereby preventing or minimizing the damage of the TFT and/or the light emitting device layer caused by a tension strain or a compression strain which occurs due to bending. In other words, the cover layer 170 can be made small so that it does not extend all the way through the entire bending area, in order to stay of out of the way during bending, thus reducing strain at the bent portion. Also, a curvature radius is decreased, since a strain which is decreased due to a reduction in thickness caused by the non-disposition of the cover layer 170, thereby implementing a display apparatus having a zero bezel.

As described above, in the display apparatus 100 according to embodiments of the present disclosure, since the cover layer 170 is provided in the non-active area NA except an area overlapping the bending part BP, the cover layer is absent from at least part of the bending area, the first substrate 110 which is flexible and has a thin thickness is prevented from being rolled in a release process, penetration of water passing through the adhesive layer 150 is prevented, and bending is performed under a condition where the damage of the TFT and/or the light emitting device layer are/is prevented or minimized. For example, an outermost edge of the cover layer 170 can be spaced apart from a center of the bending part, in order to better facilitate bending and reduce stress on the device.

The cover layer 170 according to an embodiment can be formed in the whole non-active area NA, and then, can be selectively removed from an area where the third and fourth non-active areas NA3 and NA4 overlap the bending part BP, e.g., part of the cover layer 170 overlapping with the bending area can be cut out, so that only a small portion or none of the cover layer 170 overlaps with the bending area. Also, the cover layer 170 can be patterned and formed in a non-active area other than the overlapping area. However, the present disclosure is not limited thereto.

Figure 5:
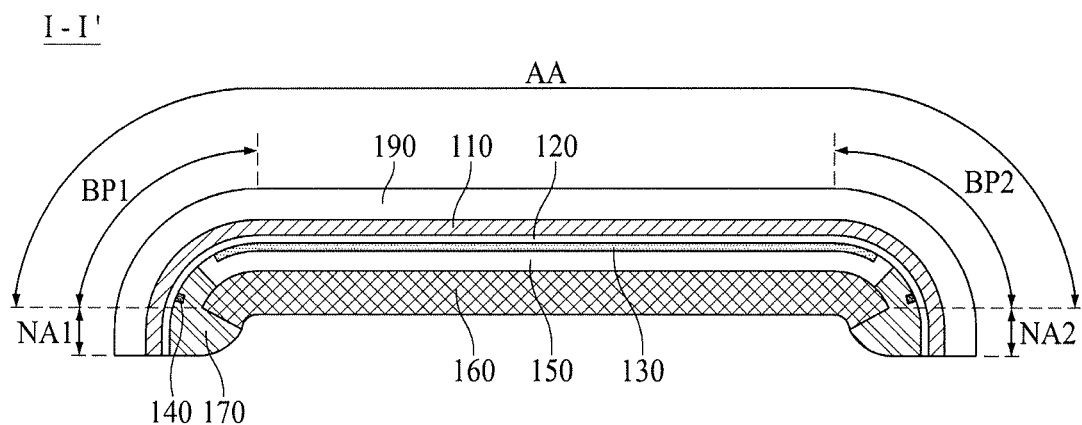
FIG. 5 is a cross-sectional view, taken along line I-I', of a bending state of the display apparatus illustrated in FIG. 1 according to an embodiment of the present disclosure.

FIG. 5 is a cross-sectional view, taken along line I-I', of a bending state of the display apparatus illustrated in FIG. 1.

Referring to FIG. 5, in the display apparatus 100 according to embodiments of the present disclosure, the bending part BP of the first substrate 110 can be bent to have a curve shape. That is, each of the first bending part BP1 and the second bending part BP2 defined on the first substrate 110 can be bent to the second surface of the second substrate 160 to have a certain curvature radius and can surround a side surface of the second substrate 160. In this instance, each of the first bending part BP1 and the second bending part BP2 can be bent to have a curvature radius of approximately 1 mm to 5 mm.

Since each of the first bending part BP1 and the second bending part BP2 is bent in a curve shape, an edge of the active area AA can be bent in a curve shape. Therefore, an edge display screen (or a sub display screen) can be provided in the edge, bent in a curve shape, of the active area AA. Further, a front display screen (or a main display screen) having substantially a planar state can be provided in an unbent portion of the active area AA.

In the display apparatus 100 according embodiments of to the present disclosure, since the cover layer 170 is not disposed in an area where the non-active area NA overlaps the bending part BP, bending can be easily performed, and the display apparatus 100 can have a bezel width of approximately 10 μm or less, based on bending of the bending part BP. Also, in the display apparatus 100 according to embodiments of the present disclosure, since the cover layer 170 is not disposed in the area where the non-active area NA overlaps the bending part BP, the TFT and/or the light emitting device layer are/is prevented from being damaged while bending is being performed.

Figure 6:
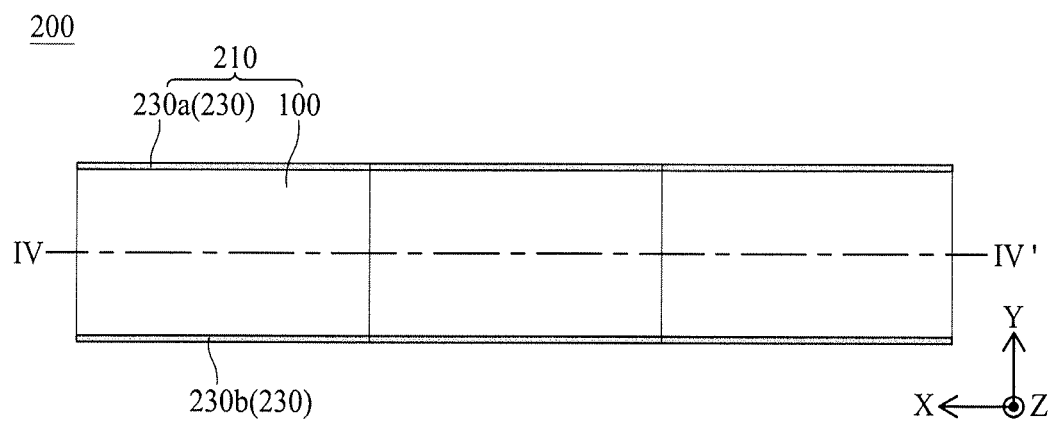
FIG. 6 is a plan view illustrating a multi-screen display apparatus according to an embodiment of the present disclosure.
Figure 7:
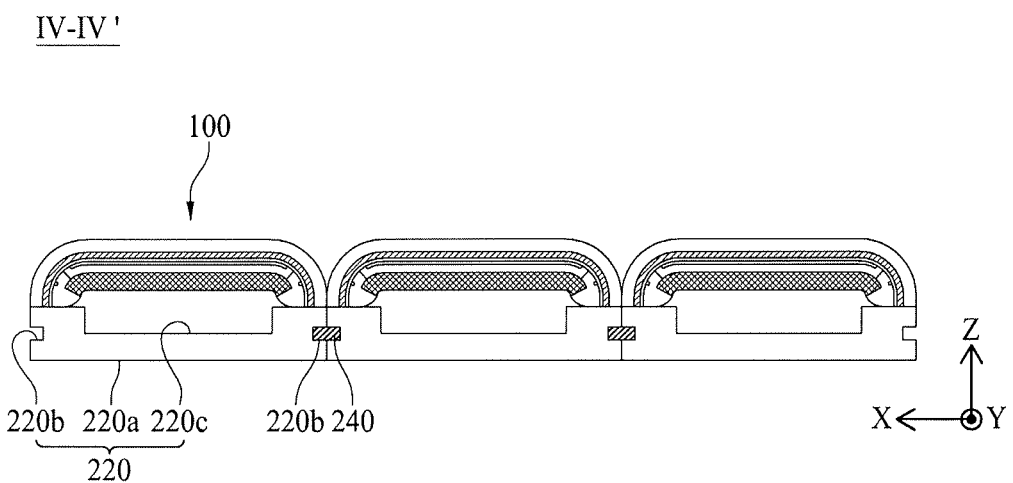
FIG. 7 is a cross-sectional view taken along line IV-IV' illustrated in FIG. 6 according to an embodiment of the present disclosure.

FIG. 6 is a plan view illustrating a multi-screen display apparatus 200 according to an embodiment of the present disclosure, and FIG. 7 is a cross-sectional view taken along line IV-IV' illustrated in FIG. 6 according to an embodiment of the present disclosure. The multi-screen display apparatus 200 can be configured with the display apparatus having a bending structure illustrated in FIG. 5.

Referring to FIGS. 6 and 7, the multi-screen display apparatus 200 according to an embodiment of the present disclosure can include a plurality of screen modules 210 each including a plurality of side surfaces, and some side surfaces among the plurality of side surface, which are parallel to each other, can be closely adhered to each other.

The plurality of screen modules 210 can each include a display apparatus 100 and a supporting frame 220.

The display apparatus 100 can have the same configuration as that of the display apparatus 100 illustrated in FIG. 5, and thus, its overlapping description is omitted.

The supporting frame 220 can accommodate the display apparatus 100. The supporting frame 220 according to an embodiment can include a floor surface 220a (e.g., lowermost surface), which supports a rear surface of the display apparatus 100, a sidewall which is provided vertical to the floor surface 220a to surround a side surface of the display apparatus 100, and at least one module coupling part 220b which is provided in each of a left side surface and a right side surface of the floor surface 220a.

The floor surface 220a can include a concave portion 220c which is concavely formed. The concave portion 220c can be concavely recessed from the floor surface 220a and can accommodate various circuits connected to a display driving circuit unit of the display apparatus 100.

The at least one module coupling part 220b can be coupled to a module coupling member 240 for closely coupling the side surfaces of the plurality of screen modules 210. The at least one module coupling part 220b according to an embodiment can include a groove which is formed to have a certain depth from each of the left side surface and the right side surface of the floor surface 220a, and in this instance, the module coupling member 240 can be a coupling pin inserted into the module coupling part 220b.

Each of the plurality of screen modules 210 can further include a front cover 230.

The front cover 230 can cover the third and fourth non-active areas NA3 and NA4 of the display apparatus 100. The front cover 230 according to an embodiment can include a first front cover 230a and a second front cover 230b.

The first front cover 230a can include an L-shaped cross-sectional surface and can be coupled to the supporting frame 220, and thus, can cover the third non-active area NA3 of the display apparatus 100.

The second front cover 230b can include an L-shaped cross-sectional surface and can be coupled to the supporting frame 220, and thus, can cover the fourth non-active area NA4 of the display apparatus 100.

The side surfaces of the plurality of screen modules 210 can be coupled to each other by the module coupling member 240 in a first direction X (or a widthwise direction). In this instance, bending parts (or edge display areas), which each have a curve shape and are provided in adjacent display apparatuses 100 can contact each other without being hidden by a sidewall of the supporting frame 220, and thus, a boundary portion between the adjacent display apparatuses 100 can be substantially removed.

In the multi-screen display apparatus 200 according to an embodiment of the present disclosure, bending parts which each have a curve shape and are provided in a plurality of display apparatuses 100 can contact each other, and thus, side surfaces of the display apparatuses 100 can be coupled to each other, thereby removing a boundary portion between adjacent display apparatuses 100. Accordingly, one continuous image, in which there is no sense of discontinuity, can be displayed across an entire screen made up of the plurality of display apparatuses, and thus, visual immersion in an image displayed on a large-size screen is enhanced, and size expandability increases.

As described above, in the display apparatus according to the embodiments of the present disclosure, the bending part is optimized for strain and is easily bent, the pixel array layer provided on the bending part is prevented from being damaged when bending is performed, and a side anti-moisture characteristic is enhanced.

Moreover, in the multi-screen display apparatus according to the embodiments of the present disclosure, one continuous image, in which a sense of discontinuity is removed or minimized, can be displayed across an entire screen, and thus, visual immersion in an image displayed on a large-size screen is enhanced, and size expandability is increased.

It will be apparent to those skilled in the art that various modifications and variations can be made in the present disclosure without departing from the scope of the disclosures. Thus, it is intended that the present disclosure covers the modifications and variations of this disclosure provided they come within the scope of the appended claims and their equivalents.

What is claimed is:
1. A display apparatus comprising:
   a first substrate including an active area, a non-active area surrounding the active area, and a bending part bent in a curve shape;

a pixel array layer disposed in the active area of the first substrate;
a second substrate disposed on the pixel array layer wherein the pixel array layer is between the first substrate and the second substrate; and
a cover layer disposed in the non-active area of the first substrate, the cover layer covering a side surface of the second substrate,
wherein the cover layer is disposed in a remaining portion of the non-active area except for an area of the non-active area that overlaps the bending part,
wherein outermost edges of the first substrate are bent towards the second substrate and surround outermost edges of the second substrate,
wherein an outermost edge of the pixel array layer is spaced apart from the cover layer in the bending part, and
wherein the bending part includes a reduced stress area that is devoid of the cover layer, and the reduced stress area is at least partially surrounded by portions of the second substrate, the cover layer, the first substrate and the pixel array layer.

2. The display apparatus of claim 1, wherein the second substrate comprises a first surface which face to the first substrate and a second surface opposite to the first surface, and
wherein the bending part of the first substrate is bent toward the second surface of the second substrate.

3. The display apparatus of claim 1, further comprising a light-transmitting film disposed on the first substrate.

4. The display apparatus of claim 1, wherein the non-active area comprises first, second, third and fourth non-active areas, and
wherein the bending part comprises:
a first bending part at an edge of the active area adjacent to the first non-active area; and
a second bending part at an edge of the active area adjacent to the second non-active area.

5. The display apparatus of claim 4, wherein the first, second, third and fourth non-active areas are a left non-active area of the first substrate, a right non-active area of the first substrate, an upper non-active area of the first substrate, and a lower non-active area of the first substrate, respectively.

6. The display apparatus of claim 4, wherein the cover layer is removed from an area where the third and fourth non-active areas overlap with the bending part.

7. The display apparatus of claim 4, wherein the cover layer is patterned in a remaining portion of the non-active area except for an area where the third and fourth non-active areas overlap with the bending part.

8. The display apparatus of claim 4, further comprising:
a pad part disposed in at least one of the third and fourth non-active areas; and
a display driving circuit unit electrically connected to the pad part.

9. The display apparatus of claim 4, further comprising a scan driving circuit disposed in at least one of the first and second non-active areas.

10. The display apparatus of claim 1, wherein the bending part has a curvature radius of 1 mm to 5 mm.

11. The display apparatus of claim 1, wherein the cover layer includes an outer curved portion and an inner notched portion opposite to the outer curved portion, and
wherein an edge of the second substrate is seated in the inner notched portion of the cover layer.

12. The display apparatus of claim 11, wherein the inner notched portion of the cover layer overlaps with the reduced stress area of the bending part in a viewing direction of the display apparatus.

13. The display apparatus of claim 1, wherein the pixel array layer includes pixels disposed in the bending part.

14. A multi-screen display apparatus comprising:
a plurality of screen modules each including a plurality of side surfaces, wherein side surfaces of adjacent screen modules among the plurality of screen modules being closely adhered to each other,
wherein each of the plurality of screen modules comprises the display apparatus of claim 1, and bending parts of adjacent display apparatuses contact each other.

15. A multi-screen display apparatus comprising a plurality of display apparatuses including the display apparatus of claim 1,
wherein bending parts of adjacent display apparatuses contact each other.

16. A display apparatus comprising:
a first screen module including:
a first substrate including a first active area, a first non-active area surrounding the first active area, and a first bending part bent in a curve shape,
a first pixel array layer disposed in the first active area of the first substrate,
a second substrate disposed on the first pixel array layer, wherein the first pixel array layer is between the first substrate and the second substrate, and
a first cover layer disposed in the first non-active area of the first substrate, the first cover layer covering a first side surface of the second substrate,
wherein the first cover layer is disposed in a remaining portion of the first non-active area except for an area of the first non-active area that overlaps the first bending part,
wherein outermost edges of the first substrate are bent towards the second substrate and surround outermost edges of the second substrate, and
wherein an outermost edge of the first pixel array layer is spaced apart from the first cover layer in the first bending part, and
wherein the first bending part includes a first reduced stress area that is devoid of the first cover layer, and the first reduced stress area is at least partially surrounded by portions of the second substrate, the first cover layer, the first substrate and the first pixel array layer; and
a second screen module including:
a third substrate including a second active area, a second non-active area surrounding the second active area, and a second bending part bent in a curve shape,
a second pixel array layer disposed in the second active area of the third substrate,
a fourth substrate disposed on the second pixel array layer, wherein the second pixel array layer is between the third substrate and the fourth substrate, and
a second cover layer disposed in the second non-active area of the third substrate, the second cover layer covering a second side surface of the fourth substrate,
wherein the second bending part includes a second reduced stress area that is devoid of the second cover layer,
wherein the first screen module includes a side surface adhered to and parallel to a side surface of the second screen module.

* * * * *